United States Patent
Do

(10) Patent No.: US 7,395,475 B2
(45) Date of Patent: Jul. 1, 2008

(54) CIRCUIT AND METHOD FOR FUSE DISPOSING IN A SEMICONDUCTOR MEMORY DEVICE

(75) Inventor: Chang-Ho Do, Ichon-shi (KR)

(73) Assignee: Hynix Semiconductor, Inc., Kyoungki-Do (KR)

(*) Notice: Subject to any disclaimer, the term of this patent is extended or adjusted under 35 U.S.C. 154(b) by 671 days.

(21) Appl. No.: 10/876,210

(22) Filed: Jun. 23, 2004

(65) Prior Publication Data

US 2004/0228191 A1 Nov. 18, 2004

(30) Foreign Application Priority Data

Dec. 1, 2003 (KR) .................. 10-2003-0086424

(51) Int. Cl.
*G01R 31/28* (2006.01)

(52) U.S. Cl. .................. 714/734; 714/719; 714/25; 714/30; 714/703; 714/709; 714/718; 714/724; 714/733; 714/745; 714/818; 702/35; 702/59; 702/117; 702/118; 702/120; 365/96; 365/201; 365/225.7

(58) Field of Classification Search .................. 714/719
See application file for complete search history.

(56) References Cited

U.S. PATENT DOCUMENTS

| | | | | |
|---|---|---|---|---|
| 5,140,554 | A * | 8/1992 | Schreck et al. | 365/201 |
| 5,517,455 | A * | 5/1996 | McClure et al. | 365/225.7 |
| 5,550,394 | A * | 8/1996 | Sukegawa et al. | 257/209 |
| 5,923,598 | A * | 7/1999 | Callahan | 365/200 |
| 6,121,820 | A * | 9/2000 | Shishikura | 327/525 |
| 6,667,916 | B2 * | 12/2003 | Kyung | 365/201 |
| 7,158,435 | B2 * | 1/2007 | Kobayashi et al. | 365/225.7 |
| 2002/0093860 | A1 * | 7/2002 | Kato et al. | 365/200 |

* cited by examiner

*Primary Examiner*—John P Trimmings
(74) *Attorney, Agent, or Firm*—Blakely, Sokoloff, Taylor & Zafman LLP

(57) ABSTRACT

A fuse disposing circuit executes a same test as in a state before a fuse is cut, even in case the fuse is cut. For this, the fuse disposing circuit in accordance with the invention includes a test mode enable confirmation section for informing whether a test mode is enabled; and a fuse set for providing a constant signal by using the output from the test mode enable confirmation section in case of the test mode, regardless of elimination or non-elimination of a fuse.

9 Claims, 3 Drawing Sheets

CIRCUIT AND METHOD FOR FUSE DISPOSING IN A SEMICONDUCTOR MEMORY DEVICE

FIELD OF THE INVENTION

The present invention relates to a semiconductor memory device; and, more particularly, to a circuit and method for fuse cutting in a test mode.

DESCRIPTION OF RELATED ART

In designing a semiconductor memory device, a fuse is utilized to adjust a target value so as to ensure a stable operation internally with respect to all unexpected changes in a manufacturing process. For this, before cutting a fuse, it needs to predict a value after cutting. Thus, during a test mode, there are first observed variations of a target value to be controlled depending on an output of the fuse before cutting; and, in fact, the fuse is then cut based on the variations. According to a conventional circuit configuration, however, there exists a shortcoming in that it does not apply circumstances in a test mode after cutting fuse practically. A concrete example is presented below.

FIG. 1 shows a circuit diagram having a fuse set for a test mode according to a prior art.

The prior art circuit comprises a plurality of fuse sets, 110a, 110b, 110c, which are connected in parallel, and a decoder 120 which inputs and decodes signals from the plurality of fuse sets 110a, 110b, 110c. Since the plurality of fuse sets 110a, 110b, 110c have a same circuit configuration and perform a same operation, only the fuse set 110a herein will be described in detail for the sake of illustration below.

In both ends of a fuse 112a in the fuse set 110a, one end (hereinafter, "node A") is coupled to a first PMOS transistor 111a which inputs a supply voltage and the other end is connected to a first NMOS transistor 113a which is coupled to a source voltage and is capable of applying it to the node A. Input to the gate of the first PMOS transistor 111a is a first test mode signal tm0, while input to the gate of the first NMOS transistor 113a is a power-up signal pwrup. Here, the first, second, third test mode signals tm0-tm2 being applied to the respective corresponding fuse sets 110a, 110b, 110c are flag signals indicating that test mode becomes enabled, wherein those signals are derived by combining a mode register set signal MRS for deciding operation mode of a semiconductor memory device with a signal which is applied to a specific pin. The node A is coupled to an input of a first inverter 114a among the first to a third inverters 114a, 115a, 116a which are connected in serial. On the other hand, there is employed a second NMOS transistor 117a that allows an input voltage of the first inverter 114a to be pull-down as the ground voltage by using the output of the first inverter 114a as control signal, to thereby stably maintain the ground voltage at the input side of the first inverter 114a during normal operation, rather than test mode. This is because the first NMOS transistor 113a is turned-off by a power-up signal pwrup which is transited to "L" state if a power is applied to the semiconductor memory device and then the fuse is cut, making the voltage level at the node A unstable due to interruption of the power.

Details of the decoder 120 for decoding the outputs from the fuse sets 110a, 110b, 110c will omitted herein because it is not directly related to the subject matters of the present invention and may be easily understood to those skilled in the art.

The operation of the fuse set circuit according to the prior art as configured above will be described below.

If a power is applied to a semiconductor memory device, a power-up signal pwrup which is transited from "H" to "L" state when a level of a supply voltage VDD reaches a preset level is applied to the first NMOS transistor 113a of the fuse set 110a. Further, the first to third test mode signals tm0, tm1, tm2 are maintained logic "L" state before they enter into test mode. Accordingly, if the power-up signal pwrup is transited to "L" state, then the node A connected to the fuse 112a is coupled to the supply voltage VDD, to thereby maintain logic "H" state.

In case the fuse 112a is not cut, if the first to third test mode signals tm0, tm1, tm2 of logic "H" state are applied by allowing the semiconductor memory device to be entered into test mode, then the first PMOS transistor 111a is turned-off and the fuse is disconnected with the supply voltage, thereby giving a same effect as in cut of the fuse. However, once the fuse 112a is disconnected, the supply voltage is not applied to the node A although the logic states of the first to third test mode signals tm0, tm1, tm2 change. In conclusion, outputs of the fuse sets are not changed, leading to a state that is incapable of performing the test mode any further.

SUMMARY OF THE INVENTION

It is, therefore, an object of the present invention to provide a circuit and method which are capable of normally executing a same test mode as in a state before a fuse is cut, even after the fuse is cut.

In accordance with an aspect of the present invention, there is provided a fuse disposing circuit for use in a semiconductor memory device, comprising: a test mode enable confirmation section for informing whether a test mode is enabled; and a fuse set for providing a constant signal using the output from the test mode enable confirmation section in case of the test mode, regardless of elimination or non-elimination of a fuse.

In accordance with another aspect of the present invention, there is provided a fuse disposing circuit for use in a semiconductor memory device, comprising: a test mode enable confirmation section for informing whether a test mode is enabled; a plurality of fuse sets for providing constant signals using the output from the test mode enable confirmation section in case of the test mode, regardless of elimination or non-elimination of a fuse; and a decoder for inputting and decoding the output signals from the plurality of fuse sets.

Preferably, the test mode enable confirmation section may output a first signal if a plurality of test mode signals that are inputted in parallel indicate test mode and a second signal if the plurality of test mode signals do not mean test mode.

Further, the test mode enable confirmation section may comprise a test mode identifier for outputting a ground voltage if at least one of the plurality of test mode signals is enabled; a latch for latching the output from the test mode identifier; and an inverter for inverting the output from the latch.

Preferably, the fuse set may comprise a fuse for outputting a constant signal using a test mode enable bar signal from the test mode enable confirmation section in case of the test mode, regardless of elimination or non-elimination of a fuse; and a comparator for comparing the test mode signal with the output from the fuse to thereby output different logic signals depending on existence or nonexistence of the fuse in case of normal operation.

In accordance with further aspect of the present invention, there is provided a fuse disposing method for use in a semiconductor memory device, comprising the steps of: (1) issuing a test mode enable bar signal having a first or second logic state depending on whether or not a plurality of test mode signals indicate test mode; (2) providing a constant signal using the test mode enable bar signal in case of the test mode, regardless of elimination or non-elimination of a fuse; and (3) producing a different logic state depending on existence or nonexistence of the fuse in case of normal operation by comparing any one of the plurality of test mode signals with the output obtained at said step (2).

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a preferred embodiment of the present invention will be described in detail with reference to the accompanying drawings. Before doing so, it should be noted that terms and words used in the description and claims are not limited to have merely conventional or dictionary meanings but will be interpreted to have meaning and concept in compliance with the technical spirit of the invention under the principle that the concept of the terms can be properly defined to explain the invention in the best manner. Thus, embodiments disclosed in the description and configuration shown in the accompanying drawings are merely the most preferred those of the various embodiments of the invention and are not to represent all the technical spirit of the invention. Therefore, it will be understood that there may be various equivalences and modifications that are capable of replacing the embodiments present in the description of the invention.

Figure 1:
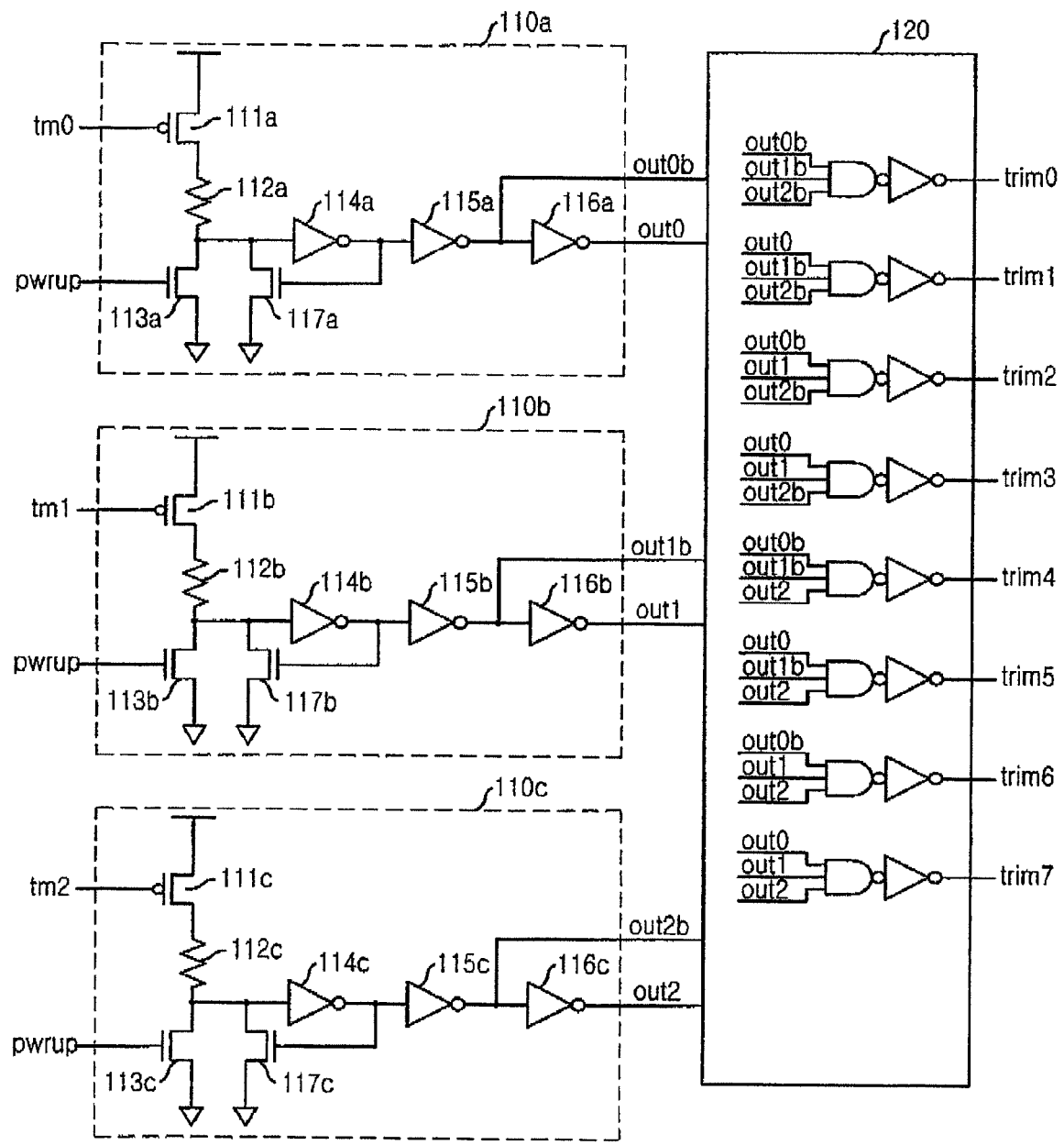
FIG. 1 shows a circuit diagram having a fuse set for a test mode according to a prior art.
Figure 2:
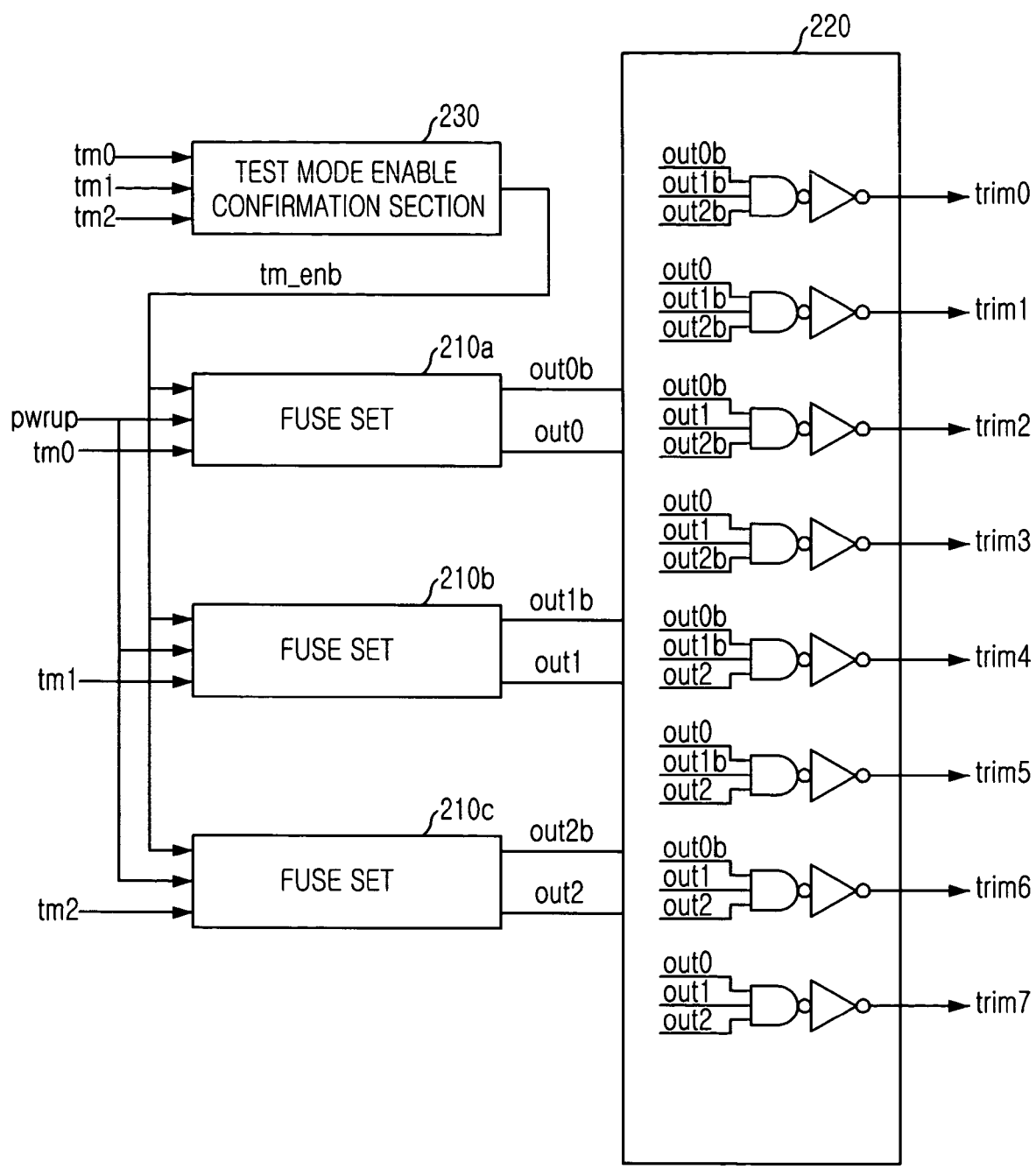
FIG. 2 is a circuit diagram having a fuse set for a test mode in accordance with present invention.

FIG. 2 is a circuit diagram having a fuse set for use in a test mode in accordance with the present invention.

The circuit having the fuse set for use in the test mode in accordance with the present invention comprises a test mode enable confirmation section 230 for informing that the test mode is enabled, a plural of fuse sets 210a, 210b, 210c for outputting constant signals by using the output from the test mode enable confirmation section in case of the test mode, regardless of existence or nonexistence of the fuse, and a decoder 220 for inputting and decoding the signals from the plural of fuse sets 210a, 210b, 210c.

Figure 3:
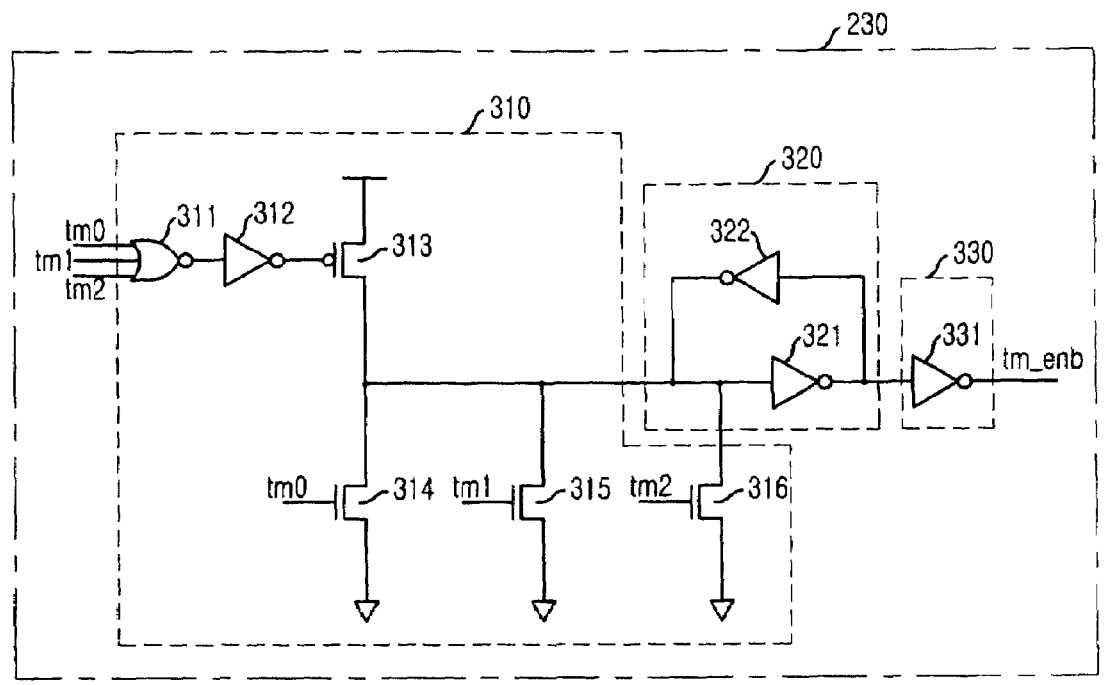
FIG. 3 depicts a detailed circuit diagram of the test mode enable confirmation section 230 shown in FIG. 2.

FIG. 3 depicts a concrete circuit of the test mode enable confirmation section 230 shown in FIG. 2.

The test mode enable confirmation section 230 comprises a test mode recognizing circuit 310 for providing a ground voltage when at least one among the first to third test mode signals tm0, tm1, tm2 is enabled, a latch section 320 for latching the ground signal from the test mode recognizing circuit 310, and an inverter 330 for inverting the output from the latch section 320.

Specifically, as shown, the test mode recognizing circuit 310 may be embodied by including a first NOR gate 311 for inputting the first to third test mode signals tm0, tm1, tm2, an inverter 312 for inverting the output from the first NOR gate 311, a PMOS transistor 313 whose gate is coupled to the output of the inverter 312 and source is connected to a supply voltage, and a plurality of NMOS transistors 314, 315, 316 whose gates use the first to third test mode signals tm0, tm1, tm2 as control signal and drains are connected to the drain of the PMOS transistor 313 in parallel. The latch section 320 includes a plurality of inverters 321, 322, which are coupled in parallel and in inverse direction.

The operation of the configuration as explained above is as follows.

First of all, if there is not the test mode, i.e., if all the first to third test mode signals tm0, tm1, tm2 are applied as logic "L" state, then the test mode enable confirmation section 230 outputs a test mode enable bar signal tm_enb of logic "H" state.

Conversely, if there is the test mode, i.e., if any one of the first to third test mode signals tm0m tm1, tm2 is applied as logic "H" state, then the PMOS transistor 313 is turned-off and any one of the NMOS transistors 314, 315, 316 is turned-on, allowing the test mode enable bar signal tm_enb to be logic "L" state.

Figure 4:
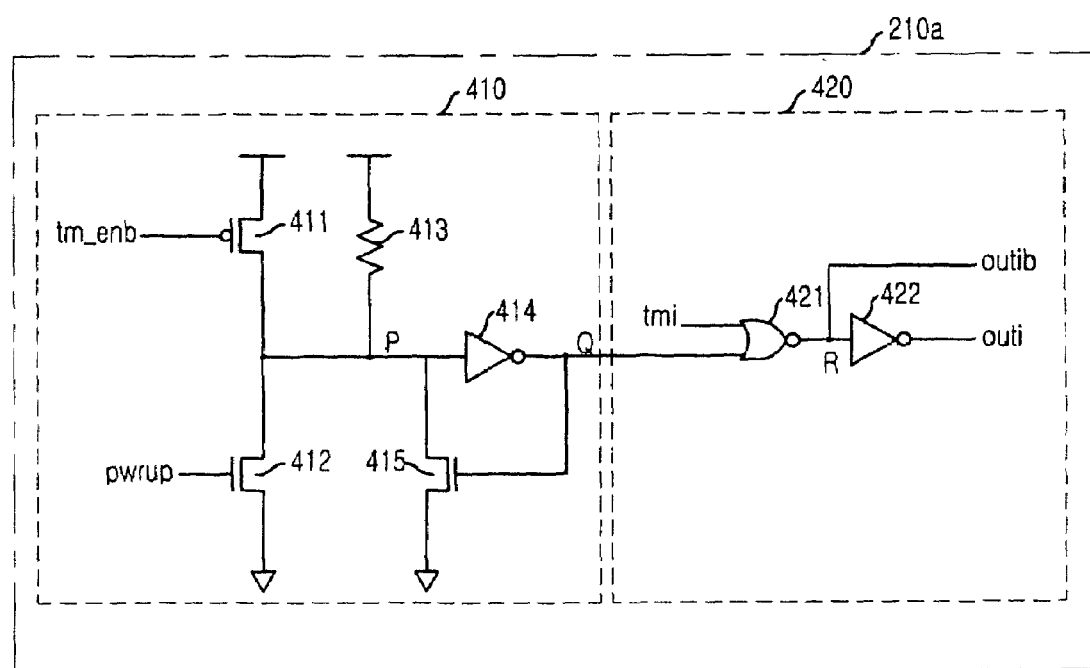
FIG. 4 presents a detailed circuit diagram of the fuse set 210a shown in FIG. 2.

FIG. 4 presents a concrete circuit diagram of the fuse set 210a shown in FIG. 2.

The fuse set 210a may be implemented by containing a fuse section 410 for outputting a same signal by using the test mode enable bar signal tm_enb in case of the test mode, regardless of cutting or no-cutting of the fuse, and a comparison circuit 420 for providing a different logic state according to existence or nonexistence of the fuse in case of normal operation by a comparison of the output of the fuse section and the test mode signal tmi.

The fuse section 410 may be embodied by providing with a PMOS transistor 411 whose gate is coupled to the test mode enable bar signal tm_enb as control signal and source is connected to a supply voltage, a NMOS transistor 412 whose gate uses a power-up signal pwrup as control signal, drain is connected to the drain of the PMOS transistor 411, and source is coupled to a source voltage, a fuse 413 whose one port is coupled to a supply voltage and the other port is connected to the drain of the PMOS transistor 411, an inverter 414 for inputting the output from the drain side of the PMOS transistor 411, and a NMOS transistor 415 whose gate uses the output of the inverter 414 as control signal to maintain the input of the inverter 414 as the ground voltage in case of normal operation.

The comparison circuit 420 may be configured by including a second NOR gate 421 for inputting the output of the fuse and the test mode signal tmi, and an inverter 422 for inverting the output of the second NOR gate 421.

Function of the fuse set in accordance with the invention as configured above can be summarized as Table.1 below.

TABLE 1

|  | Fuse | tm_enb | Node P | Node Q | tmi | Node R |
| --- | --- | --- | --- | --- | --- | --- |
| Test mode | Cut | L | H | L | H | L |
|  | No-cut | L | H | L | H | L |
| Normal mode | No-cut | H | H | L | L | H |
|  | Cut | H | L | H | L | L |

That is, from the above Table. 1, it can be seen that the same logic signal is outputted at node R in case of the test mode, regardless of cut or no-cut of the fuse. However, during the normal operation, logic "H" signal is outputted at node R if the fuse is not cut, while logic "L" signal is outputted at node R if the fuse is cut.

On the other hand, details of the fuse sets 210b, 210c will be omitted herein because their configuration and operation are the same as those of the fuse set 210a.

The present invention having the configurative features as mentioned above has advantages that it can normally carry out the test mode as before the fuse is cut even after it is cut, thereby confirming whether a cause of any abnormal environment that may rise after cutting the fuse and then tuning level is related to the fuse's cutting. This allows the development period of the semiconductor memory device for which its product life becomes gradually short to be reduced.

The present application contains subject matter related to Korean patent application No. 2003-86424, filed in the Korean Patent Office on Dec. 1, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A fuse disposing circuit for use in a semiconductor memory device, comprising:
   a test mode enable confirmation section for informing whether a test mode is enabled; and
   a fuse set coupled to an output node of the test mode enable confirmation section for providing a constant signal using the output from the test mode enable confirmation section in case of the test mode, regardless of elimination or non-elimination of a fuses
   wherein the test mode enable confirmation section outputs a first signal if a plurality of test mode signals that are inputted in parallel indicate the test mode is enabled and a second signal if the plurality of test mode signals do not indicate the test mode is enabled.

2. The fuse disposing circuit as recited in claim 1, wherein the test mode enable confirmation section comprises:
   a test mode identifier for outputting a ground voltage if at least one of the plurality of test mode signals is enabled;
   a latch for latching the output from the test mode identifier; and
   an inverter for inverting the output from the latch.

3. The fuse disposing circuit as recited in claim 2, wherein the test mode identifier comprises:
   a NOR gate for inputting the plurality of test mode signals;
   an inverter for inverting the output from the NOR gate;
   a PMOS transistor whose gate is connected to the output line of the inverter and source is coupled to a supply voltage; and
   a plurality of NMOS transistors whose gates use the plurality of test mode signals as control signal and drains are coupled to the drain of the PMOS transistor in parallel.

4. The fuse disposing circuit as recited in claim 2, wherein the latch comprises a plural of inverters that are connected in parallel and in inverse direction.

5. The fuse disposing circuit as recited in claim 1, wherein the fuse set comprises:
   a fuse section for outputting a constant signal using a test mode enable bar signal from the test mode enable confirmation section in case of the test mode, regardless of elimination or non-elimination of a fuse; and
   a logic unit for comparing the test mode signal with the output from the fuse section, to thereby output different logic signals depending on existence or nonexistence of the fuse in case of normal operation.

6. The fuse disposing circuit as recited in claim 5, wherein the fuse section comprises:
   a PMOS transistor whose gate uses test mode enable bar signal as control signal and source is connected to a supply voltage;
   a first NMOS transistor whose gate uses a power-up signal as control signal, drain is connected to the drain of the PMOS transistor in parallel, and source is coupled to a ground voltage,
   a fuse whose one port is coupled to the supply voltage and the other port is connected to the drain of the PMOS transistor;
   an inverter for inputting the output from the drain side of the PMOS transistor; and
   a second NMOS transistor whose gate uses the output of the inverter as control signal.

7. The fuse disposing circuit as recited in claim 5, wherein the logic unit comprises:
   a NOR gate for inputting the output from the fuse section and the test mode signal; and
   an inverter for inverting the output from the NOR gate.

8. A fuse disposing circuit for use in a semiconductor memory device, comprising:
   a test mode enable confirmation section for informing whether a test mode is enabled;
   a plurality of fuse sets coupled to an output node of the test mode enable confirmation section for providing constant signals using the output from the test mode enable confirmation section in case of the test mode, regardless of elimination or non-elimination of a fuse; and
   a decoder for inputting and decoding the outputs from the plurality of fuse sets,
   wherein the test mode enable confirmation section outputs a first signal if a plurality of test mode signals that are inputted in parallel indicate the test mode is enabled and a second signal if the plurality of test mode signals do not indicate the test mode is enabled.

9. A fuse disposing method for use in a semiconductor memory device, comprising the steps of:
   (1) issuing a test mode enable bar signal having a first or second logic state depending on whether or not a plurality of test mode signals indicate a test mode;
   (2) providing a constant signal based on the test mode enable bar signal in case of the test mode, regardless of elimination or non-elimination of a fuse; and
   (3) producing a different logic state depending on existence or nonexistence of the fuse in case of normal operation by logically combining any one of the plurality of test mode signals with the output obtained at said step (2),
   wherein the issuing a test mode enable bar signal includes outputting a first signal if the plurality of test mode signals that are inputted in parallel indicate the test mode and outputting a second signal if the plurality of test mode signals do indicate the test mode.

* * * * *

UNITED STATES PATENT AND TRADEMARK OFFICE
CERTIFICATE OF CORRECTION

| | | |
|---|---|---|
| PATENT NO. | : 7,395,475 B2 | Page 1 of 1 |
| APPLICATION NO. | : 10/876210 | |
| DATED | : July 1, 2008 | |
| INVENTOR(S) | : Do | |

It is certified that error appears in the above-identified patent and that said Letters Patent is hereby corrected as shown below:

In Claim 1, line 9, please delete "fuses" and insert -- fuses, --.

Signed and Sealed this

Twenty-third Day of September, 2008

JON W. DUDAS
*Director of the United States Patent and Trademark Office*

UNITED STATES PATENT AND TRADEMARK OFFICE
CERTIFICATE OF CORRECTION

PATENT NO. : 7,395,475 B2 Page 1 of 1
APPLICATION NO. : 10/876210
DATED : July 1, 2008
INVENTOR(S) : Do It is certified that error appears in the above-identified patent and that said Letters Patent is hereby corrected as shown below:

Column 5, In Claim 1, line 28, please delete "fuses" and insert -- fuses, --.

This certificate supersedes the Certificate of Correction issued September 23, 2008.

Signed and Sealed this

Fourteenth Day of October, 2008

JON W. DUDAS
*Director of the United States Patent and Trademark Office*